United States Patent [19]

Latz et al.

[11] Patent Number: 5,531,877
[45] Date of Patent: Jul. 2, 1996

[54] MICROWAVE-ENHANCED SPUTTERING CONFIGURATION

[75] Inventors: Rudolf Latz, Rodgau; Roland Gesche, Seligenstadt, both of Germany

[73] Assignee: Leybold Aktiengesellschaft, Hanau, Germany

[21] Appl. No.: 108,078

[22] Filed: Aug. 17, 1993

[30] Foreign Application Priority Data

Sep. 10, 1992 [DE] Germany .......................... 42 30 291.9

[51] Int. Cl.⁶ .................................................. C23C 14/34
[52] U.S. Cl. ................ 204/298.19; 204/298.08; 204/298.16; 204/298.17
[58] Field of Search ................. 204/298.08, 298.16, 204/298.17, 298.19, 298.37, 298.38, 298.2, 298.18

[56] References Cited

U.S. PATENT DOCUMENTS

| | | | |
|---|---|---|---|
| 4,604,180 | 8/1986 | Hirukawa et al. | 204/298.18 |
| 4,610,770 | 9/1986 | Saito et al. | 204/192.1 |
| 4,721,553 | 1/1988 | Saito et al. | 204/298.16 |
| 4,776,918 | 10/1988 | Otsubo et al. | 204/298.38 |
| 4,971,674 | 11/1990 | Hata | 204/298.2 |
| 5,006,219 | 1/1991 | Latz et al. | 204/298.16 |
| 5,196,105 | 3/1993 | Feuerstein et al. | 204/298.17 |
| 5,230,784 | 7/1993 | Yoshida | 204/298.16 |

FOREIGN PATENT DOCUMENTS

| | | |
|---|---|---|
| 3425344 | 1/1985 | Germany . |
| 3920834 | 2/1991 | Germany . |

OTHER PUBLICATIONS

JP Patent Abstracts of Japan: 62–170475 A, C–469, Jan. 16, 1988, vol. 12, No. 15.
63—297557 A, C–581, Apr. 4, 1989, vol. 13, No. 134.

*Primary Examiner*—R. Bruce Breneman
*Assistant Examiner*—Rodney G. McDonald
*Attorney, Agent, or Firm*—Felfe & Lynch

[57] ABSTRACT

The invention relates to a microwave-enhanced sputtering configuration. In this sputtering configuration a magnetron cathode is disposed in a housing whose target opposes a substrate. At both sides of the target is provided in each instance a microwave inlet comprising a waveguide coupled with a cavity resonator. The waveguide is implemented so that the microwave extends parallel to the target surface. Around the target is looped a first magnet coil generating a first magnetic field, while around an L-shaped end of the waveguide is looped a second magnet coil.

8 Claims, 3 Drawing Sheets

MICROWAVE-ENHANCED SPUTTERING CONFIGURATION

BACKGROUND OF THE INVENTION

The invention relates to a microwave-enhanced sputtering configuration including a vacuum chamber, a target in the vacuum chamber which is connected to an electrode connected to a power supply, a magnetic device whose magnetic field exits from the target and again enters into it, a microwave which is guided into the region of the target characterized by an electromagnet placed around the target.

The application of thin layers is required in numerous fields of technology. For example, glass panes are coated in order to provide them with special properties or watch cases comprising a less noble material are coated with a layer comprising a noble material.

For the application of thin layers on substrates, processes have already been suggested of which only electroplating and coating out of a plasma shall be mentioned. Coating out of a plasma has gained increasingly in importance in the last years because it permits a multiplicity of materials as coating material.

In order to generate a plasma suitable for coating, various processes have also been suggested. Of these processes the cathode sputtering process, also referred to as sputtering, is of great interest because of its high coating rates. The coating rates can still be increased in sputtering if a microwave is radiated into the volume in front of the sputtered cathode.

Several devices for a microwave-enhanced sputtering are already known (U.S. Pat. No. 4,610,770, U.S. Pat. No. 4,721,553, DE-A-3,920,834). The microwaves are herein introduced into the plasma region either parallel or perpendicularly or at a given angle to the substrate surface. Through the cooperation of the magnetic field of the magnetron with the microwaves an electron cyclotron resonance (ECR) is established which intensifies the ionization of the plasma particles.

Of disadvantage in most known devices is, however, that the ECR condition occurs in the proximity of the sputter cathode where the excitation of the particles is not as necessary as in the region of the substrate. In order to remedy this disadvantage, in the device according to DE-A-3 920 834 the microwave is radiated onto a substrate which, in turn, is penetrated by the field lines of a permanent magnet. In this way the ECR condition is fulfilled directly above the substrate. In this known device, however, a plasma discharge can only take place up to a given minimum voltage and up to a given pressure. Even with very strong magnetic fields at the target surface, the plasma ignition voltage can not be lowered further. But high discharge voltages lead to undesirable effects, such as for example, the inclusion of noble gases into the substrate structure or to radiation damage.

The invention is therefore based on the task of extending the working range of magnetron cathode discharges toward low discharge voltages and/or working pressures.

SUMMARY OF THE INVENTION

In accordance with the invention, microwave-enhanced sputtering configuration of the magnetron type comprises a) a vacuum chamber; b) a target in the vacuum chamber which is connected to an electrode connected to a power supply; c) a magnet device whose magnetic field exits from the target and again enters into it; d) microwave distribution means for guiding a microwave into the region of the target, characterized by e) said distribution means including an electromagnet placed around the target.

The advantage achieved with the invention resides in particular therein that at a high plasma density and at relatively low particle energy discharges are already possible at low cathode voltages. The pressures at the point of onset of the discharges are also very low. In the case of reactive processes, moreover, activation of the reactive particles leads to a marked reduction of the reactive gas partial pressure. If, for example, oxygen is used as the reactive gas, the undesirable back-sputtering effects are reduced.

BRIEF DESCRIPTION OF THE DRAWINGS

An embodiment example of the invention is depicted in the drawings and will be explained in the following in greater detail. Therein show.

DESCRIPTION OF THE PREFERRED EMBODIMENT

Figure 1:
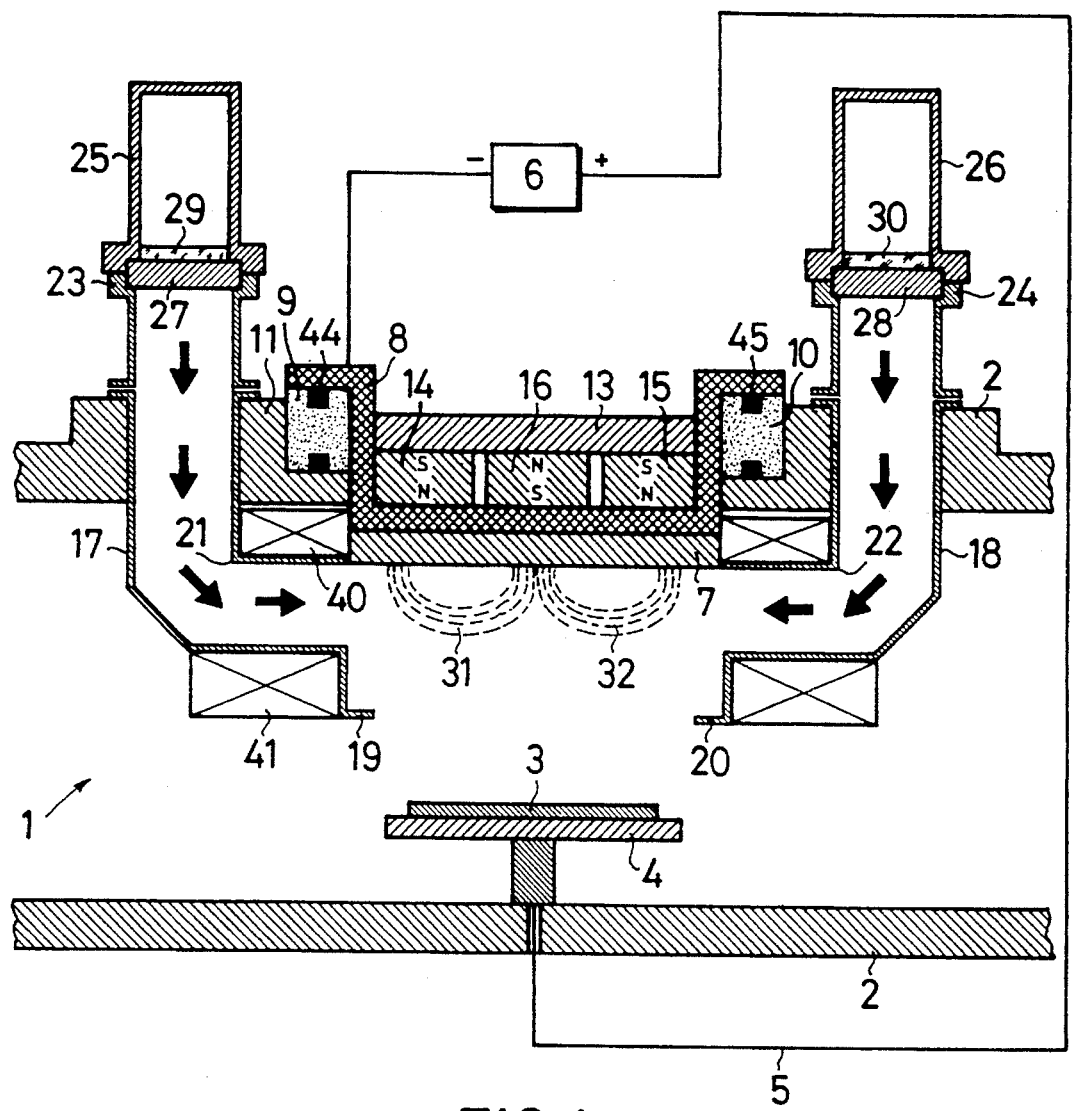
FIG. 1 a segment of a plasma chamber with a magnetron cathode and microwave irradiation.

In FIG. 1 is depicted a segment of a plasma chamber 1 whose housing 2 is only depicted by way of suggestion. In this housing 2 is disposed a substrate 3 to be coated on a support 4 which is connected via an electrical line 5 to the positive pole of a power supply 6. It is understood that the support 4 serving as mounting for the substrate 3 does not need to be disposed stationarily. This support can herein also be a movable carrier such as is the case in general in in-line installations. The support 4 also does not need to be connected to a positive potential but rather can be implemented as an electrically insulated element or be connected to a separate voltage source. With a separate voltage source a bias voltage can be set with the aid of which it is possible to control reasonably the number and the energy of the particles which impinge on substrate 4.

Opposing the substrate 3 is provided a sputter electrode 7 which is connected with a cathode tub 8. To the cathode tub 8 is connected the negative pole of the power supply 6. The cathode tub 8 rests on electrical insulations 9, 10 which, in turn, are embedded in a recess on the upper side 11 of housing 2, and provided with sealing rings 44, 45.

In the cathode tub 8 are disposed three permanent magnets 14 to 16 with a yoke 13. On both sides of the sputter electrode 7 there are provided two waveguides 17, 18 whose longitudinal axes extend parallel to the surface of the sputter electrode 7 and which terminate in an L-shaped metal sheet 19, 20. The L-shaped metal sheet 19, 20 is the front portion of a cathode shielding box which functions as an anode and represents a distribution diaphragm in this region. Both waveguides 17, 18 have a 90° bend 21, 22 at which it is bent upwards and, via a flange 23, 24, is connected with a cavity resonator 25, 26. Between cavity resonators 25, 26 and waveguides 17, 18 there are provided quartz panes 29, 30 through which microwaves can penetrate. These quartz panes 29, 30 in terms of pressure separate the plasma or vacuum chamber 1 from the outside environment.

Through the special configuration of north and south poles of the permanent magnets 14 to 16 circular arc-form magnetic field lines 31, 32 are formed in which an electron cyclotron resonance occurs with the irradiation of microwaves. The waveguides 17, 18 guide the microwave energy over the L-shaped metal sheets 19, 20 directly into the region between target 7 and substrate 3. There it is absorbed by the gases present. It is understood that through a gas inlet (not shown) a noble gas, for example argon, and/or a reactive gas, for example oxygen, can be introduced.

In the configuration depicted in FIG. 1, low voltages of the power supply 6 suffice already in order to effect a glow discharge for example at a pressure of 1 μbar. If a reactive gas is used, the reaction partial pressure can be considerably reduced which in the case of oxygen decreases the effects of undesirable back-sputtering. This is particularly of importance when coating with high-temperature superconductors or with indium or tin oxide layers.

In order to enhance this positive effect are provided a first electromagnet 40 and a second electromagnet 41. While the first electromagnet 40 is placed annularly around the target 7, the second electromagnet 41 is disposed at the end of the waveguides 17, 18 and specifically in the L-shaped region 19, 20. Electromagnets 40, 41 in FIG. 1 have a rectangular cross section. In practice, however, electromagnets with square cross sections are preferred.

Instead of annularly, the electromagnets 40, 41 can also be placed rectangularly around the target 7 or around the metal sheets 19, 20.

Figure 2:
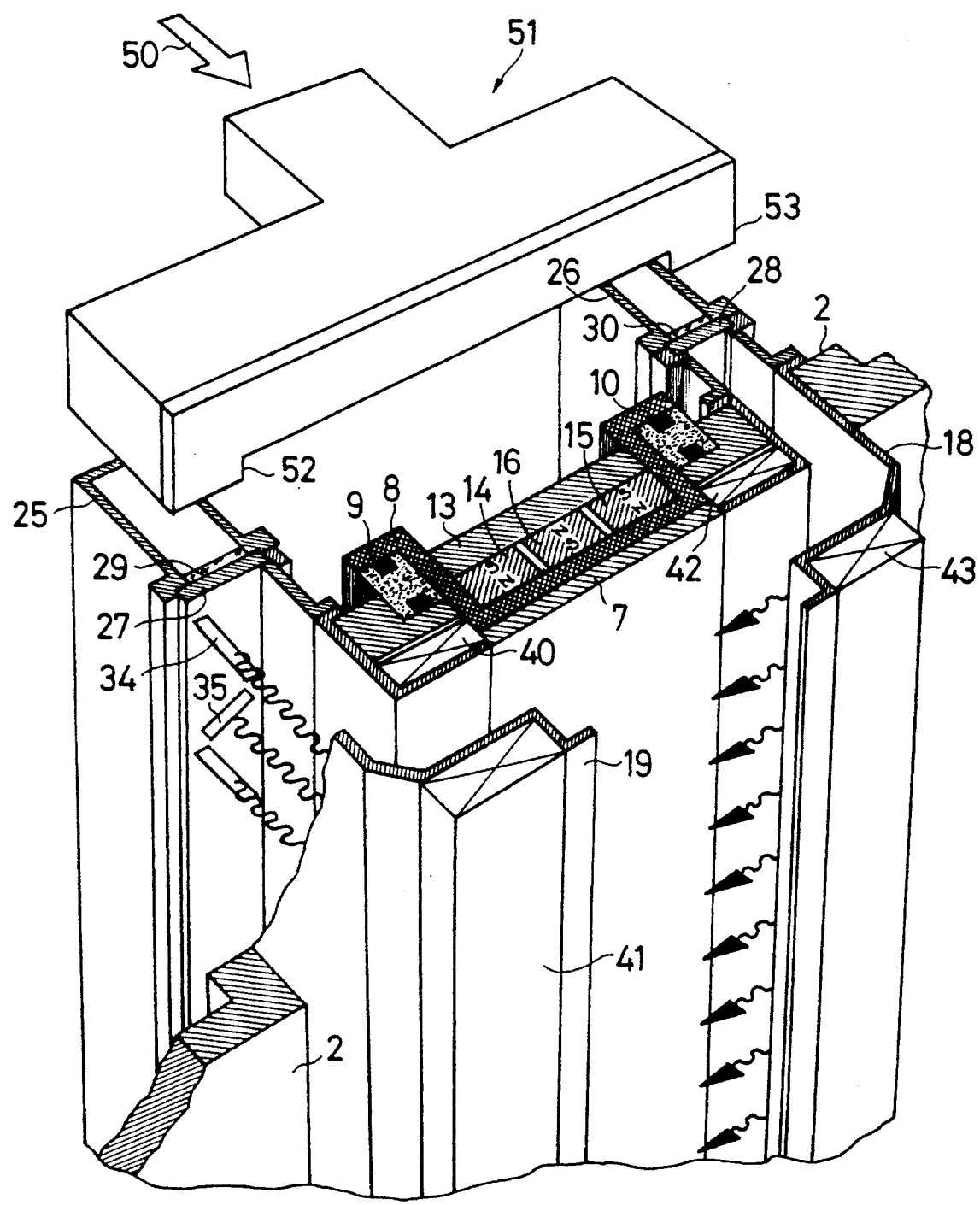
FIG. 2 a perspective representation of the radiation region of the microwave in the plasma chamber.

In FIG. 2 essential parts of the configuration according to FIG. 1 are again shown in perspective. It is evident that a microwave 50 passes from a (not shown) oscillator into a distributor 51 and there via a port 52, 53 into the cavity resonator 25, 26. From the cavity resonators 25, 26 the microwaves are introduced via the quartz panes 29, 30 into the waveguides 17, 18 from where they can effect an electron cyclotron resonance directly under the target 7.

The lateral portion 27, 28, facing in each instance the quartz panes 29, 30 of the cavity resonators 25, 26, comprises at the distance of one half the wavelength of the standing microwave developing in the resonators 25, 26, slits 34, 35 from which exit the microwaves.

Coils 40, 42 and coils 41, 43 form a total configuration through which a more or less homogeneous magnetic field parallel to the target surface is superimposed on the magnetron field of cathode 8. In a magnetic field of this type the electrons can interact very effectively with the microwave. This leads to a further ionization of the plasma. In addition, the plasma distribution becomes overall more uniform which also results in better target utilization.

Figure 3:
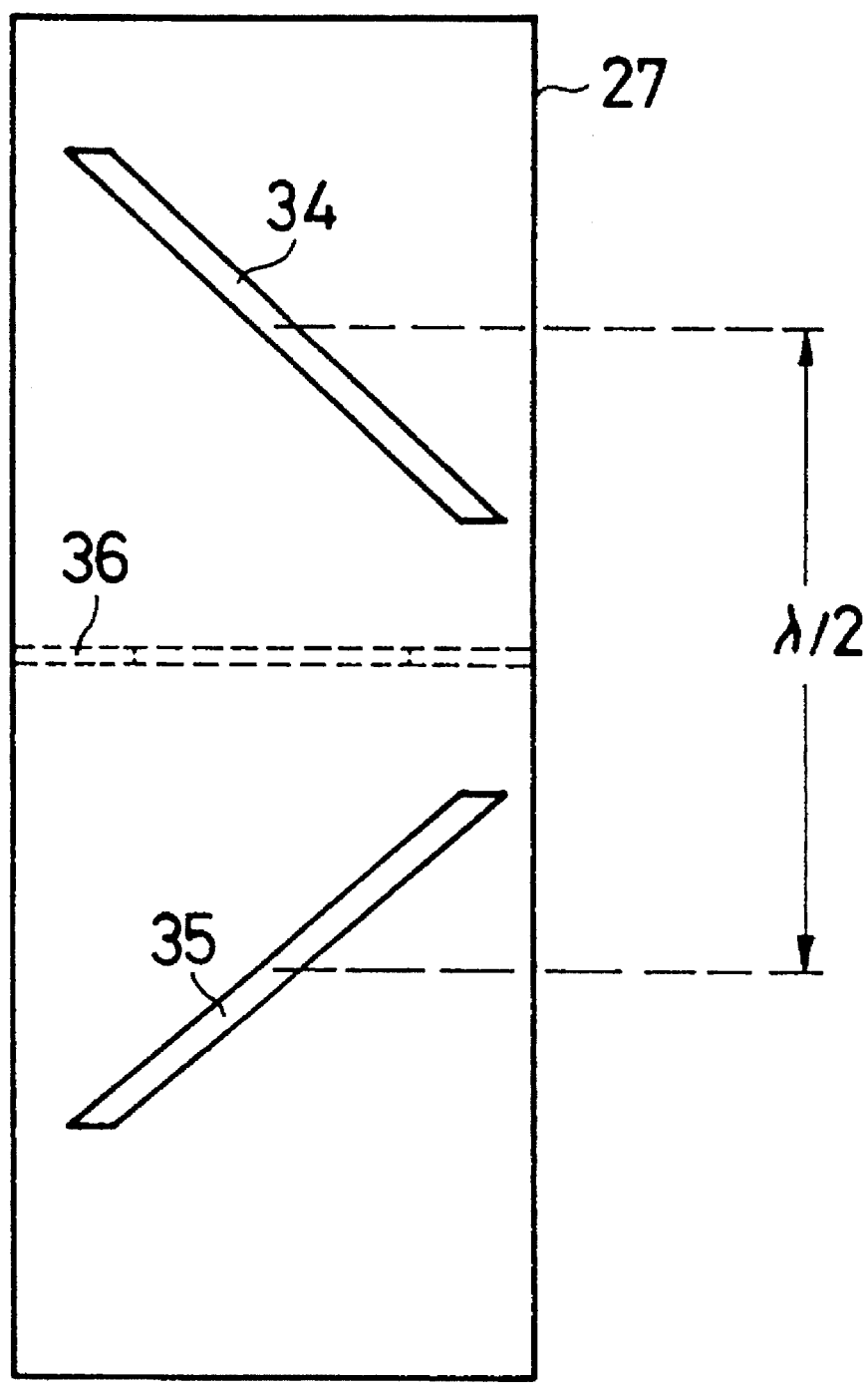
FIG. 3 a slit configuration in a $TE_{10}$ cavity resonator.

In FIG. 3 is depicted a detail from FIG. 2 which shows the precise position of slits 34, 35 in a wall 27 of a cavity resonator, for example of cavity resonator 25, at 2.45 GHz. These slits 34, 35 form an angle of 90 degrees and have a mutual center distance of λ/2. Relative to the wall 27 they have an inclination of 45 degrees.

Behind wall 27 can be seen a diaphragm 36 in the waveguide 25. It is understood that the wall 27 depicted in FIG. 3 extends upward and/or downward and that it can comprise further slits which all have a distance of λ/2 from the particular adjacent slits. In long configurations the slits, consequently, repeat periodically. The microwave intensity exiting from the slits can be controlled via diaphragms 36 between the slits in the resonator, which diaphragms are more or less constricted.

What is claimed is:

1. Microwave-enhanced sputtering configuration of the magnetron type comprising
   a) a vacuum chamber;
   b) an elongate target in the vacuum chamber which is connected to an electrode connected to a power supply, said target having parallel long sides;
   c) a magnet device whose magnetic field exits from the target and again enters into it;
   d) microwave distribution means comprising first and second spaced apart elongate cavity resonators which supply microwaves at wavelength λ to respective first and second elongate waveguides, each said cavity resonator being separated from the respective waveguide by an elongate pane permeable to microwaves and an elongate wall having a row of slits with centers spaced at a distance of λ/2, said waveguides providing microwaves into a volume in front of the target from said long sides of said target, and
   e) an electromagnet placed around the periphery of the target.

2. Microwave-enhanced sputtering configuration as stated in claim 1, characterized in that the magnet device comprises three permanent magnets which are connected by one another with a yoke.

3. Microwave-enhanced sputtering configuration as stated in claim 1, characterized in that the magnet device and a yoke are disposed in a cathode.

4. Microwave-enhanced sputtering configuration as stated in claim 3, characterized in that the cathode is mounted via insulators to a housing of the vacuum chamber.

5. Microwave-enhanced sputtering configuration as in claim 1, wherein each said waveguide has an end, around which ends a second electromagnet is placed.

6. Magnetron sputtering apparatus comprising
   a vacuum chamber,
   an elongate target having parallel long sides in said vacuum chamber, said target being connected to cathode means,
   magnet means for generating an arcuate magnet field which exits and enters the target,
   first and second elongate waveguide means for supplying microwaves parallel to said target from respective said long sides,
   first and second elongate cavity resonators for supplying microwaves of wavelength λ to respective first and second waveguides,
   first and second elongate microwave permeable panes separating respective cavity resonators from respective elongate waveguide means, and
   first and second elongate walls parallel to said panes, each wall having therein a row of slits with centers spaced at a distance of λ/2.

7. Magnetron cathode as in claim wherein each slit in each wall is oriented at 90 degrees to each adjacent slit.

8. Magnetron cathode as in claim 6 wherein said slits have centers spaced at a distance of 6.1 cm.

* * * * *

UNITED STATES PATENT AND TRADEMARK OFFICE
CERTIFICATE OF CORRECTION

PATENT NO. : 5,531,877
DATED : July 2, 1996
INVENTOR(S) : Latz, et. al.

Page 1 of 3

It is certified that error appears in the above-identified patent and that said Letters Patent is hereby corrected as shown below:

In column 1, lines 10-12, delete "a microwave which is guided into the region of the target characterized by an electromagnet placed around the target" and insert -- and waveguides for introducing microwaves into the region of the target -- .

In column 1, line 46, after "DE-A-3 920 834", insert -- (to which U.S. 5,006,219 corresponds) -- .

In column 2, lines 2-3, delete "characterized by " and insert -- and -- .

In column 2, line 3, delete "said distribution means including".

In column 2, line 47, delete "a sputter electrode" and insert -- an elongate target --.

In column 2, line 48, delete "connected with" and insert -- mounted on -- .

In column 2, line 54, delete "both" and insert -- opposite --.

In column 2, lines 54-55, delete "sputter electrode" and insert -- target --.

In column 2, line 55, delete "two" and insert -- first and second --.

In column 2, lines 56-57, delete "sputter electrode" and insert -- target --.

UNITED STATES PATENT AND TRADEMARK OFFICE
CERTIFICATE OF CORRECTION

PATENT NO. : 5,531,877
DATED : July 2, 1996
INVENTOR(S) : Latz, et. al.

It is certified that error appears in the above-identified patent and that said Letters Patent is hereby corrected as shown below:

In column 2, line 61, delete "it is" and insert - - they are - -.

In column 2, line 62, delete "a flange" and insert - - flanges - -.

In column 2, line 62, delete "is" and insert - - are - -.

In column 2, lines 62-63, delete "a cavity resonator" and insert - - first and second cavity resonators - -.

In column 2, line 64, after "30", insert - - and apertured walls 27, 28 - -.

In column 3, line 2, delete "circular arc-form" and insert - - arcuate - -.

In column 3, line 21, delete "around the" and insert - - periphery of - -.

In column 3, line 33, delete " a (not shown)" and insert - - an - -.

In column 3, line 34, delete "a port" and insert - - ports - -.

In column 3, line 35, delete "resonator 25, 26" and insert - - resonators 25, 26 where standing microwaves of wavelength $\lambda$ are developed - -.

In column 3, line 39, delete "lateral portion" and insert - - first and second walls - -.

In column 3, line 39, delete "in each instance".

UNITED STATES PATENT AND TRADEMARK OFFICE
CERTIFICATE OF CORRECTION

PATENT NO. : 5,531,877
DATED : July 2, 1996
INVENTOR(S) : Latz, et. al.

It is certified that error appears in the above-identified patent and that said Letters Patent is hereby corrected as shown below:

In column 3, lines 40-41, delete "comprises" and insert - - each have - -.

In column 3, line 41, delete "the distance" and insert - - a center to center spacing - -.

In column 3, lines 41-42, delete "of the standing microwave developing in the resonators 25, 26" and insert - - $\lambda$ - -.

In column 3, line 56, after "$\lambda/2$", insert - -, which in this example is 6.1 cm - -.

Signed and Sealed this

Twenty-fifth Day of July, 2000

Attest:

Q. TODD DICKINSON

*Attesting Officer*   *Director of Patents and Trademarks*